US007675447B1

(12) United States Patent
Coulson

(10) Patent No.: US 7,675,447 B1
(45) Date of Patent: Mar. 9, 2010

(54) LOW-COST AND NOISE-INSENSITIVE MOTION DETECTOR

(75) Inventor: David S. Coulson, Burlington (CA)

(73) Assignee: ZiLog, Inc., San Jose, CA (US)

( * ) Notice: Subject to any disclaimer, the term of this patent is extended or adjusted under 35 U.S.C. 154(b) by 56 days.

(21) Appl. No.: 12/154,611

(22) Filed: May 24, 2008

(51) Int. Cl.
    H03M 3/00 (2006.01)
(52) U.S. Cl. ...................... 341/143; 341/155
(58) Field of Classification Search ........... 341/143, 341/155, 156; 702/189; 324/158.1; 340/500, 340/540
    See application file for complete search history.

(56) References Cited

U.S. PATENT DOCUMENTS

| | | | |
|---|---|---|---|
| 5,659,316 | A | 8/1997 | Stierli .................. 341/143 |
| 7,248,155 | B2 | 7/2007 | Wang et al. .............. 340/507 |
| 7,323,978 | B2 | 1/2008 | Parker et al. ............. 340/507 |
| 7,546,223 | B2 * | 6/2009 | Parker et al. ............. 702/189 |
| 2007/0010972 | A1 * | 1/2007 | Praskovsky et al. ......... 702/189 |
| 2007/0058819 | A1 * | 3/2007 | Hertz et al. .................. 381/74 |
| 2007/0114414 | A1 | 5/2007 | Parker et al. ............. 250/338.3 |
| 2007/0288108 | A1 | 12/2007 | Parker et al. ................. 700/94 |

OTHER PUBLICATIONS

Analog Devices Datasheet for ADuC845 entitled, "MicroConverter® Multichannel 24-/16-Bit ADCs with Embedded 62 kB Flash and Single-Cycle MCU," Analog Devices, Inc. 2005, D04741-0-2/05(B); 108 pages.
Renesas Microcomputer General Presentation entitled, "Super Low Power Microcomputers," Renesas Technology Corp., Apr. 25, 2008 Rev. 12.00; 50 pages.
Texas Instruments Application Report entitled, "Ultra-low Power Motion Detection using the MSP430F2013" by Zack Albus, Texas Instruments 2005, SLAA283; 6 pages.
Frank Forster, "Ultra-low power microcontrollers for embedded security applications," Texas Instruments Feb. 2006; 3 pages (28, 30 and not numbered).
Texas Instruments Data Sheet entitled, "MSP430F42X Mixed Signal Microcontroller," Texas Instruments Jun. 2007, SLAS421A; 42 pages.
Zilog Application Note entitled, "Using Z8 Encore!™ for DMA-ADC Implementation," Zilog, Inc. 2003, AN013203-0503; 35 pages.
Zilog Product Specification entitled, "High-Performance 8-Bit Microcontrollers: Z8 Encore! XP® 8K and 4K Series," Zilog, Inc. 2007, PS022823-1207; 35 pages (i-xi; 121-133; 272-282).

* cited by examiner

Primary Examiner—Jean B Jeanglaude
Assistant Examiner—Joseph Lauture
(74) Attorney, Agent, or Firm—Imperium Patent Works; T. Lester Wallace; Darien K. Wallace

(57) ABSTRACT

A microcontroller has a compact 8-bit processor and a differential input sigma-delta ADC (SDADC). In a low-cost pyro-electric sensor motion detector application, a sensor output signal is supplied onto a second differential input of the SDADC. A first programmable internal reference voltage source supplies VREF1 via an internal signal path onto a first differential input of the SDADC. A second programmable internal reference voltage source supplies VREF2 onto a reference voltage input of the SDADC. VREF1 sets the center of the SDADC input sample window, thereby avoiding the need to provide an external AC blocking capacitor. VREF2 sets the size of the window. Proper window sizing and sample averaging and the high-resolution SDADC obviate the need for input signal amplification. Throughput requirements on the 8-bit processor are reduced by providing a hardware averager and associated DMA controller, thereby making the overall solution a low-cost, noise-insensitive, solution.

21 Claims, 5 Drawing Sheets

LOW-COST MOTION DETECTOR
(EMBODIMENT #3)

TYPICAL CONVENTIONAL LOW-COST
MOTION DETECTOR

LOW-COST MOTION DETECTOR

INPUT VOLTAGES TO SDADC
(MORE DC OFFSET, EMBODIMENT#1)

INPUT VOLTAGES TO SDADC
(LESS DC OFFSET, EMBODIMENT#1)

LOW-COST MOTION DETECTOR (EMBODIMENT #2)

LOW-COST MOTION DETECTOR (EMBODIMENT #3)

LOW-COST AND NOISE-INSENSITIVE MOTION DETECTOR

TECHNICAL FIELD

The described embodiments relate to motion detectors, and more particularly to microcontrollers having pyroelectric sensor interfaces and associated functionality.

BACKGROUND INFORMATION

FIG. 1 (Prior Art) is a simplified block diagram of a so-called "motion detector" or "motion sensor" as might be a part of a common home security system. The motion detector 1 detects motion by detecting infrared radiation emitted by a person. For example, the face of a person emits a substantial amount of infrared radiation that usually can be detected at a reasonable distance under normal lighting and temperature conditions by a passive infrared (PIR) sensor 2. PIR sensor 2 is also referred to as a pyroelectric sensor. A multi-section lens 3 is placed in front of the detector. Lens 3 has a plurality of lens sections. Each lens section directs infrared radiation from a corresponding respective zone onto the sensor. The diagram of FIG. 1 is a top-down illustration and shows four such zones 4-7. These zones may, for example, be pie-slice-shaped zones that fan out from sensor 2 across a room of a home. If an infrared radiation source such as a human face is located at location A in zone 4, then infrared radiation emitted from the face will be directed by lens 3 onto sensor 2. If the person walks through the field of view of the detector from location A to location B from zone 4, to zone 5, to zone 6, to zone 7, then the electrical signal output from sensor 2 will rise and fall and rise and fall as the person moves in and out of the various zones. The resulting varying signal is referred to here as the desired signal. The desired signal is usable to detect motion of the person.

The magnitude of the variation of the desired signal is, however, small. It may, for example, rise and fall no more than one or two millivolts. This small desired signal is buried in a larger noise signal. The larger noise signal may, for example, have a peak-to-peak amplitude of ten millivolts. Fortunately, the frequency of the noise signal is generally higher than the frequency of change in the desired signal. Both the desired signal and the noise ride on a large DC offset voltage. The DC offset voltage has a large magnitude and changes with changes in environmental conditions and operational conditions. The DC offset voltage may, for example, be a DC voltage in the range of from 0.4 volts to 2.0 volts.

The circuit of FIG. 1 is a circuit such as might be found in a typical low cost home security system. The AC coupling 8 blocks the DC offset voltage from reaching the input of the gain stage 9. AC coupling 8 typically involves a fairly large capacitance such as a twenty microfarad electrolytic capacitor. Gain stage 9 may have a gain of one thousand, and is typically realized in discrete components as one or two operational amplifiers. The amplified desired and noise signals pass from gain stage 9 to a low pass filter 10. Low pass filter 10 blocks the relatively higher frequency noise signal but allows the relatively lower frequency desired signal to pass to a microcontroller 11. An analog-to-digital converter (ADC) 12 in the microcontroller digitizes the signal. ADC 12 has a resolution of approximately ten bits, and is a successive approximation type of ADC as is typically included in inexpensive microcontroller integrated circuits. The processor 13 of the microcontroller is programmed to realize a decision engine 14. Decision engine 14 analyzes the output of ADC 12 and determines whether detected changes in the desired signal should be considered to constitute movement of an object that warrant sounding an alarm.

The performance of motion detector 1 could be improved in many respects, but such improvement would generally be thought to increase the cost of the motion detector. In some motion detector markets, such as the home security system market, cost of the motion detector is extremely important. Therefore, for practical cost reasons, motion detector performance has generally not been improved for the low cost home security alarm market.

SUMMARY

A novel microcontroller integrated circuit has a low-cost and compact 8-bit processor core and a relatively powerful, high-resolution, differential input sigma-delta ADC (SDADC). In one embodiment, a programmable gain differential output amplifier (PGDOA) supplies differential signals onto the differential input leads of the differential SDADC. In a pyroelectric sensor motion detector application, a pyroelectric sensor output signal is supplied onto a second differential input lead of the PGDOA. A first programmable internal reference voltage source is coupled to supply a first reference voltage VREF1 via an internal signal path onto a first differential input lead of the PGDOA. A second programmable internal reference voltage source is coupled to supply a second reference voltage VREF2 via an internal signal path onto a reference voltage input lead of the SDADC.

VREF1 is set to center an ADC input sample window with respect to the sensor signal such that the need to provide an external AC blocking capacitor is obviated. VREF2 is set to size the ADC input sample window, thereby making superior use of SDADC resolution. Processing throughput requirements on the 8-bit processor are reduced by providing a novel hardware averager and associated DMA controller that take processing load off the processor. The compact 8-bit processor core and smaller associated support circuitry and data bus help reduce the die size (and therefore cost) of the overall microcontroller so that the microcontroller is usable for very cost-sensitive applications such as home security system applications. Due to the novel use of VREF1 and VREF2 and the internal signal paths and the high-resolution SDADC, the pyroelectric sensor can be directly connected to an input terminal of the microcontroller without any intervening active circuitry or large AC coupling capacitors, thereby making the motion detector relatively insensitive to RF radiation and other similar interferences. The novel combination of features makes an overall motion detector involving the microcontroller have superior RF radiation insensitivity, while simultaneously providing a low-cost solution for the highly cost sensitive home security system market.

In some embodiments, the programmable differential output gain amplifier (PGDOA) described above is not used. The absence of signal gain in the signal path from the pyroelectric sensor to the SDADC input lead is, however, acceptable due to special use of the resolution of SDADC. Groups of SDADC output data values are averaged, thereby increasing the effective resolution of the SDADC from ten bits to fourteen bits. This increased effective resolution of the SDADC, in combination with the proper sizing and centering of the SDADC input window, obviates the need for amplification of the pyroelectric sensor output sensor prior to reaching the SDADC.

In some embodiments, the second programmable internal reference voltage source is not provided. Rather, VREF1 is supplied onto the reference voltage input lead of the SDADC. VREF1 therefore sets the size of the SDADC window.

Although the setting of the so-called "center" of the SDADC window and the setting of the "size" of the SDADC window are not independently settable in this embodiment, there may be, depending on the application, a VREF1 value that results in an acceptable window size and center. This VREF1 value may be dynamically adjusted during motion detector operation to optimize operation depending on motion detector operating conditions.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 2:
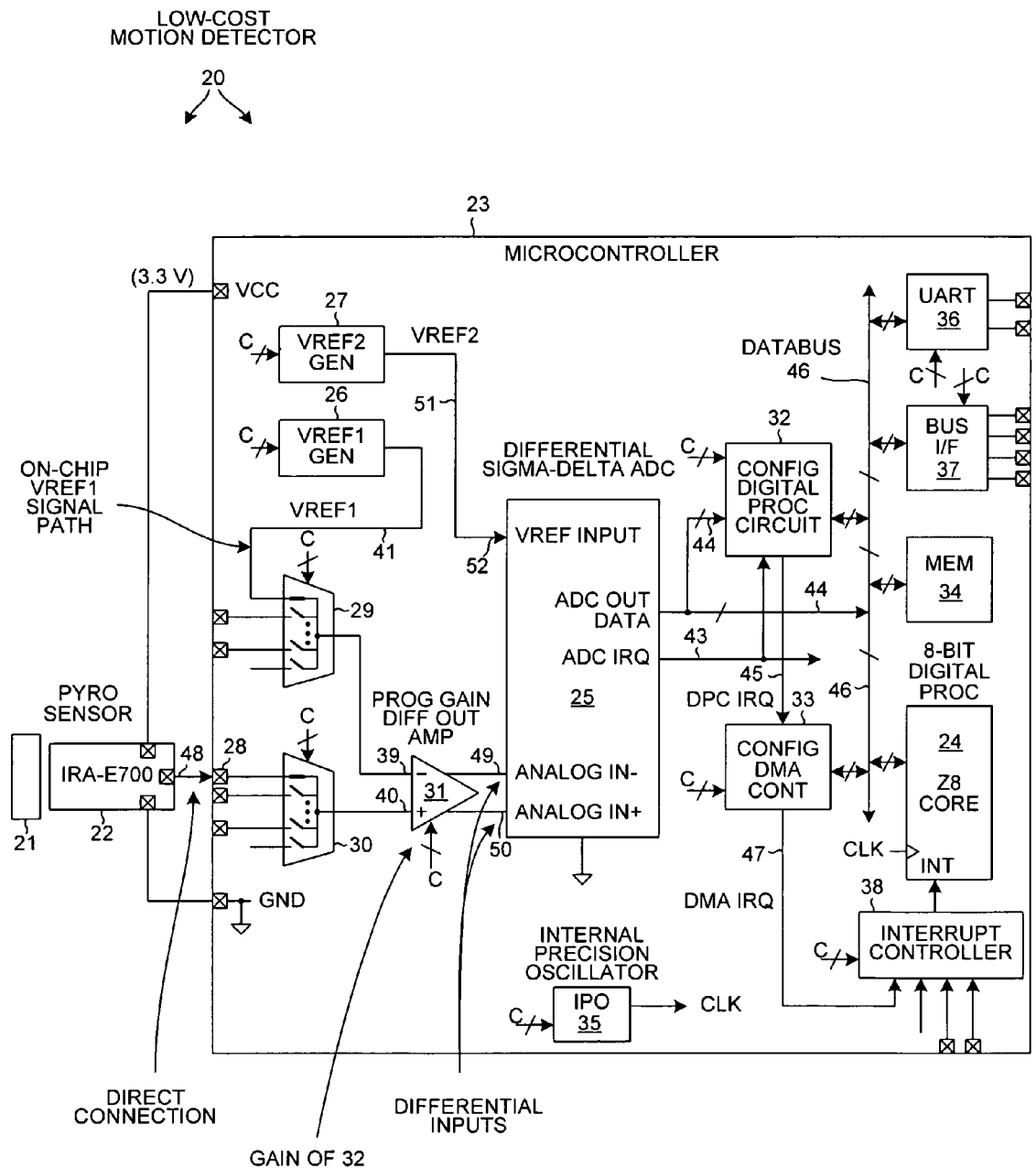
FIG. 2 is a diagram of a motion detector in accordance with one novel aspect.

FIG. 2 is a simplified diagram of a motion detector 20 in accordance with one novel aspect. Detector 20 includes a multi-section lens 21, a pyroelectric sensor 22 and a microcontroller integrated circuit 23. Pyroelectric sensor 22 and lens 21 function in a conventional way and as described in the background section of this patent document. Components 21, 22 and 23 are fixed to a printed circuit board, and the printed circuit board is contained in a suitable enclosure (not shown) with a window so that infrared radiation can reach sensor 22. A connector or cord or other signal communication structure (not shown) is provided so that detector 20 can output motion detection information to a device (for example, security system controller) that receives the information.

Microcontroller integrated circuit 23 includes a compact 8-bit processor core 24, a differential input sigma-delta analog-to-digital converter (SDADC) 25, a first internal reference voltage generator 26, a second internal reference voltage generator 27, a plurality of terminals including analog input terminal 28, a first analog multiplexing circuit 29, a second analog multiplexing circuit 30, a programmable gain differential output amplifier (PGDOA) 31, a configurable digital processing circuit 32, a configurable direct memory access (DMA) controller 33, an amount of memory 34 (program and data memory such as, for example, FLASH and/or RAM), an internal precision oscillator (IPO) 35, a universal asynchronous receiver transmitter (UART) 36, a serial bus interface 37, and an interrupt controller 38. Microcontroller integrated circuit 23, in this embodiment, is a modification of a microcontroller available from Zilog Inc, such as for example a member of the Z8 XP FOX2A family of microcontrollers that have compact 8-bit Z8 processor cores.

By writing appropriate control values into control registers (not shown), 8-bit processor 24 can configure and control each of the other blocks of microcontroller integrated circuit 23. The lines labeled "C" in FIG. 2 represent the control values stored in the control registers. For example, processor 24 can set the magnitude of a first reference voltage VREF1 output by the first reference voltage generator 26, can set the magnitude of a second reference voltage VREF2 output by the second reference voltage generator 27. Processor 24 can control first analog multiplexer 29 to couple a selected one of a plurality of signals on the data input leads of the first multiplexer onto the multiplexer output and onto a first differential input lead 39 of programmable gain amplifier 31. One of the plurality of signals is the first reference voltage VREF1 that is recieved via an on-chip signal path 41 from first reference voltage generator 26.

Processor 24 can also control second analog multiplexer 30 to couple a selected one of a plurality of signals on the data input leads of the second multiplexer onto the multiplexer output lead and to a second differential input lead 40 of programmable gain amplifier 31. One of the plurality of signals is a pyroelectric sensor output signal present on terminal 28. Processor 24 can set the gain of programmable gain amplifier 31.

In one novel aspect, processor 24 can configure the configurable digital processing circuit 32 so that circuit 32 processes ADC output values received on bus conductors 44 in a selectable one of a plurality of ways. Each ADC output value is a sixteen bit value that includes a 14-bit data value, an overflow bit, and a sign bit. In one example, circuit 32 is configured to receive the ADC interrupt request signal (ADC IRQ) on conductor 43. When the ADC IRQ signal is asserted, SDADC 25 is providing a 16-bit ADC output value. Circuit 32 responds by automatically reading the ADC output value via bus conductors 44 of databus 46. Circuit 32 reads and averages each successive group of 14-bit ADC output data values. When the resulting average is available in a register in block 32, circuit 32 asserts an interrupt signal DPC IRQ onto conductor 45. The 14-bit resulting average value can be read across processor data bus 46. The control value that controls circuit 32 determines how many ADC output data values are averaged, whether the average is a running average or a simple average, and other parameters affecting the processing performed by circuit 32. Circuit 32 is a configurable hardware state machine that performs its processing functions in hardware without fetching instructions. In some embodiments, circuit 32 is configurable to perform a digital filter calculation that is more complex and sophisticated than a simple average or running average. In some such examples, processor 24 loads the coefficients of the digital filter into circuit 32 via data bus 46. If certain of the control values are zero, then the digital filter calculation is simplified and is the average function. If the certain control values are non-zero, then the digital filter function is a more complex digital filter function. The sample averaging function is therefore only one function that the configurable digital processing circuit 32 can be configured to perform.

Processor 24 can also configure configurable DMA controller 33 to read information from a specified location or locations on the microcontroller integrated circuit and to write the information to another location or locations on the microcontroller integrated circuit. In one example, configurable DMA controller 33 is configured to read average values (such an "average value" is one example of a "processed value") from circuit 32 via data bus 46, and to write the average values into memory 34 across data bus 46 for later accessing by processor 24. Once a predetermined number of new average values has been transferred to memory 34, the configurable DMA controller 33 interrupts the processor 24 via conductor 47 and interrupt controller 38. Processor 24 responds by accessing memory 34 and reading the average values and using the average values in a motion detection decision engine. See the following documents for more details on motion detectors in general, and motion detection decision engines and software in particular: 1) published U.S. Patent Application Publication 2007/0114414 to Parker et al.; and U.S. Patent Application Publication 2007/0288108 by Parker et al. (the entire subject matter of both of these two published application is incorporated herein by reference). The program of instructions executed by processor 24 is stored in memory 34 (a processor-readable medium). Execution of this program causes processor 24 to control and configure the other blocks of microcontroller integrated circuit 23 and to perform its digital filtering and motion detection decision functions as set forth above.

In one advantageous aspect, the signal output terminal 48 of pyroelectric sensor 22 is directly connected to terminal 28 of the microcontroller without any intervening active circuitry. No electrolytic capacitor is coupled to the connection. It is recognized that commercially available motion detectors are subjected to testing whereby radio frequency (RF) energy is directed at the motion detector. In the presence of this RF energy, the motion detector must continue to operate satisfactorily in accordance with certain requirements. Circuitry and conductors between the pyroelectric sensor and the microcontroller of the prior art circuit of FIG. 1 can pick up such RF energy or are otherwise adversely affected by the test. The circuit of FIG. 1, however, operates satisfactorily under current tests. In the future, however, the test will likely change such that the motion detector will have to operate satisfactorily in the presence of even higher frequency RF energy. In such a situation, providing the analog preprocessing circuitry between the pyroelectric sensor and the microcontroller may be a serious problem. In the novel circuit of FIG. 2, however, the output of pyroelectric sensor 22 is directly connected to terminal 28 of microcontroller 23 by a short PCB trace. No electrolytic capacitor is coupled to the connection. This short PCB trace is realized such that the motion detector meets future EMC testing requirements when the motion detector is subjected to 6 GHz RF energy.

Figure 1:
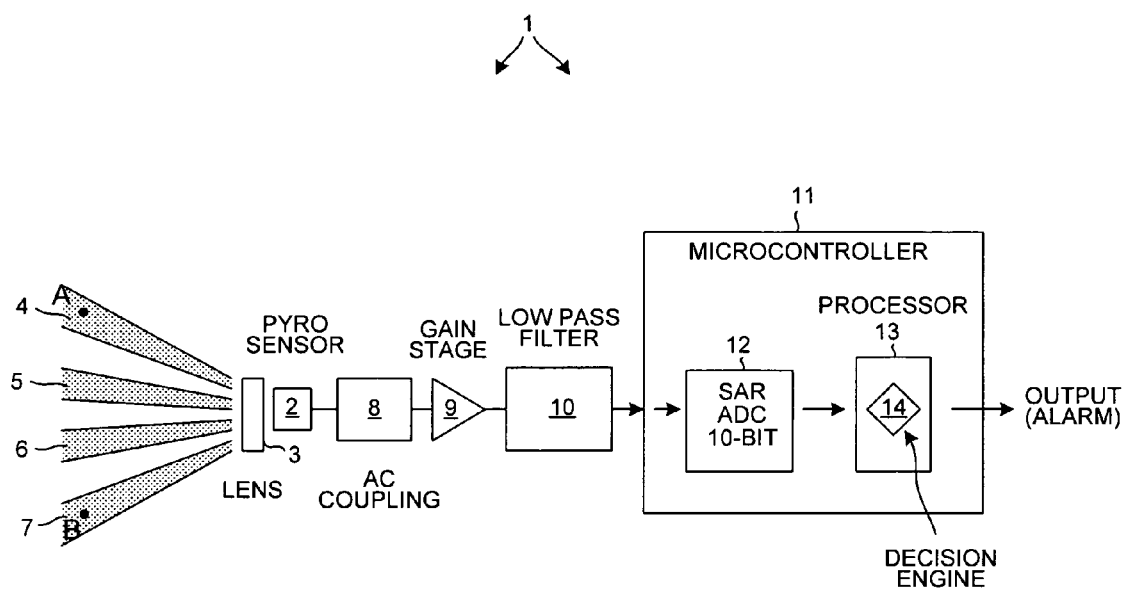
FIG. 1 (Prior Art) is diagram of a prior art motion detector of a type often employed in low-cost home security systems.

In the prior art of FIG. 1, AC coupling was provided to block the DC offset voltage output by the pyroelectric sensor. In the circuit of FIG. 2, VREF1 is supplied via internal connection 41 and first analog multiplexing circuit 29 onto a differential input lead 39 of PGDOA 31. If the voltage on the other differential input lead 40 of PGDOA 31 is above VREF1, then amplifier 31 outputs differential signals of a positive polarity onto the differential input leads 49 and 50 of SDADC 25. If the voltage on the other differential input lead 40 is below VREF1, then amplifier 31 outputs differential signals of a negative polarity onto the differential input leads 49 and 50 of SDADC 25. If the voltage on the other differential input lead 40 is equal to VREF1, then amplifier 31 outputs equal voltage differential signals onto the differential input leads 49 and 50 of SDADC 25. It is therefore seen that amplifier 31 and the VREF1 voltage on its input lead 39 effectively blocks the large DC offset voltage component of the pyroelectric sensor output from reaching SDADC 25. This is accomplished without conducting VREF1 outside microcontroller integrated circuit 23 through a first terminal, and then conducting VREF1 back into microcontroller integrated circuit 23 through a second terminal. No terminals are used to direct VREF1 onto input lead 39 due to internal path 41 and analog multiplexing circuit 29.

In the prior art circuit of FIG. 1, gain is provided by gain stage 9 to increase the magnitude of the small (for example, one millivolt peak-to-peak) desired signal so that the amplitude of the desired signal will be adequately large on the input of ADC 12. In the circuit of FIG. 2, the same programmable gain amplifier 31 that handles the DC offset signal also provides gain for increasing the magnitude of the desired signal. No external operational amplifier circuits or other gain stage is present between the output of pyroelectric sensor 22 and the input terminal 28 of the microcontroller integrated circuit 23.

In the prior art circuit of FIG. 1, the desired signal is separated from the higher frequency noise, at least to some degree, by external low pass filter 10. In the circuit of FIG. 2, the desired signal is separated from the higher frequency noise by digital filtering. This digital filtering is a combination of the filtering of the averaging performed by circuit 32, and subsequent processing and digital filtering carried out by processor 24. No external low pass filter 10 is present between the output of pyroelectric sensor 22 and the input terminal 28 of the microcontroller integrated circuit 23.

In another novel aspect, the motion detector of FIG. 2 includes the second programmable internal reference voltage source 27 and the internal signal path 51 that extends to the VREF INPUT lead 52 of SDADC 25. SDADC 25 is a truly differential input sigma-delta ADC that converts the voltage difference between the voltages on input leads 49 and 50 into a sixteen-bit ADC output value. Fourteen of the bits are a 14-bit ADC output data value, one bit is an overflow bit, and one bit is a sign bit. The range of input voltages between leads 49 and 50 over which SDADC converts ranges from zero volts to the voltage on VREF INPUT lead 52. In the circuit of FIG. 2, VREF2 is supplied onto the VREF INPUT lead 52 so that the range of input voltages that SDADC 25 converts is VREF2. This range of input voltages is also referred to here as the "ADC input sample window size". Accordingly, increasing VREF2 increases the ADC input sample window size, whereas decreasing VREF2 decreases the ADC input sample window size. SDADC 25 breaks the input sample window into steps such that each step is converted into an associated signed 14-bit ADC output value number. Such a "step" is a range of input voltages for which SDADC outputs the same ADC output data value. By reducing VREF2 to an appropriate value, the desired signal and noise signal are translated into ADC output data values that range over a larger proportion of the steps of SDADC 25. For example, in the example of FIG. 2 the supply voltage (VCC) received by the microcontroller integrated circuit is 3.3 volts, whereas the input sample window size is 2.0 volts and VREF2 is 2.0 volts.

Figure 3:
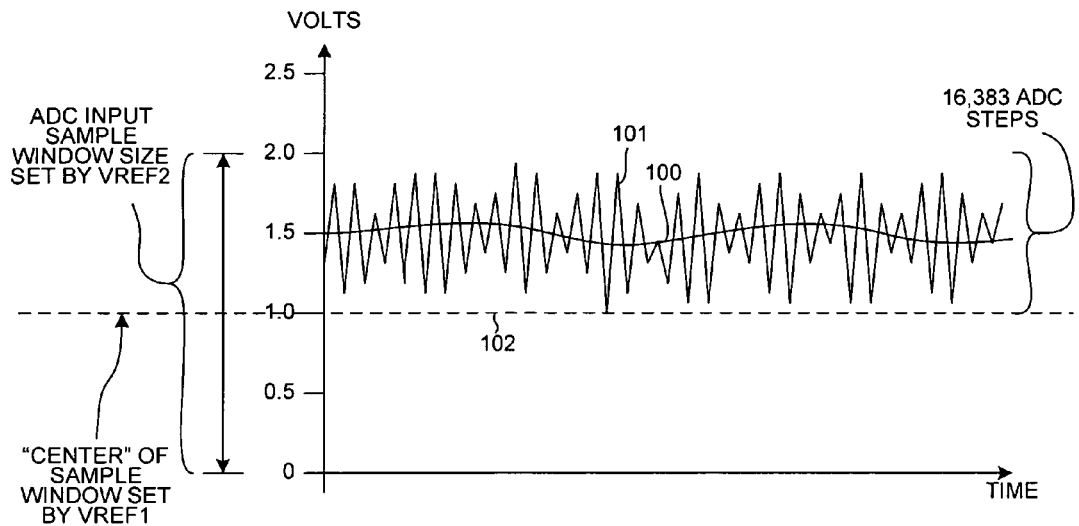
FIG. 3 is a waveform diagram that illustrates how two internal voltage reference generators and associated internal signal paths are used to set the "size" of an ADC sample window, and to set the "center" of the ADC sample window. The desired signal and higher frequency noise signal are shown riding together on a relatively higher DC offset voltage.

FIG. 3 is a waveform diagram that illustrates the small amplitude desired signal 100 that is buried in the higher frequency, and higher amplitude, noise signal 101 in the embodiment of FIG. 2. Both signals ride together on a 1.5 volt DC offset voltage. Dashed line 102 represents the center of the ADC input sample window as set by VREF1. The size of the sample window (2.0 volts in this example) is set by VREF2. The upper half of the sample window (identified by the label "65535 ADC steps") corresponds to about 16383 ADC output data values having a positive sign bit. The lower half of the sample window corresponds to about 16383 ADC output data values having a negative sign bit. Although the "center" of the window as set by VREF2 and as indicated by dashed line 102 is halfway between the bottom of the window at zero volts and the top of the window at 2.0 volts in this example, the "center" of the window can in other examples be located anywhere within the window due to the ability to independently set VREF1 and VREF2.

Figure 4:
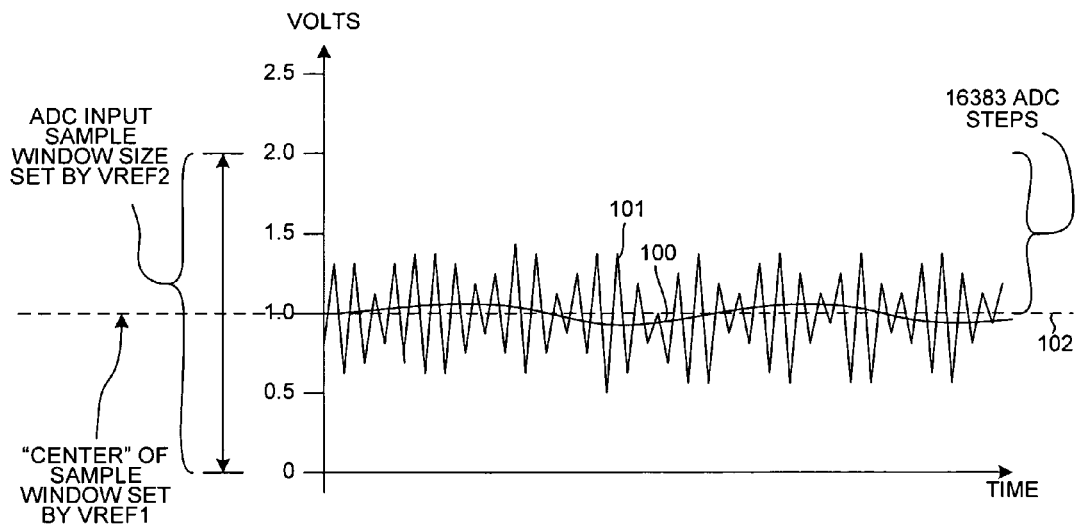
FIG. 4 is a waveform diagram of the signals of FIG. 3, except that in FIG. 4 the desired signal and higher frequency noise signal are shown riding together on a relatively low DC offset voltage.

FIG. 4 is a waveform diagram that illustrates the desired signal 100 and higher frequency noise signal 101 when both signals ride on a smaller 1.0 volt DC offset voltage.

Figure 5:
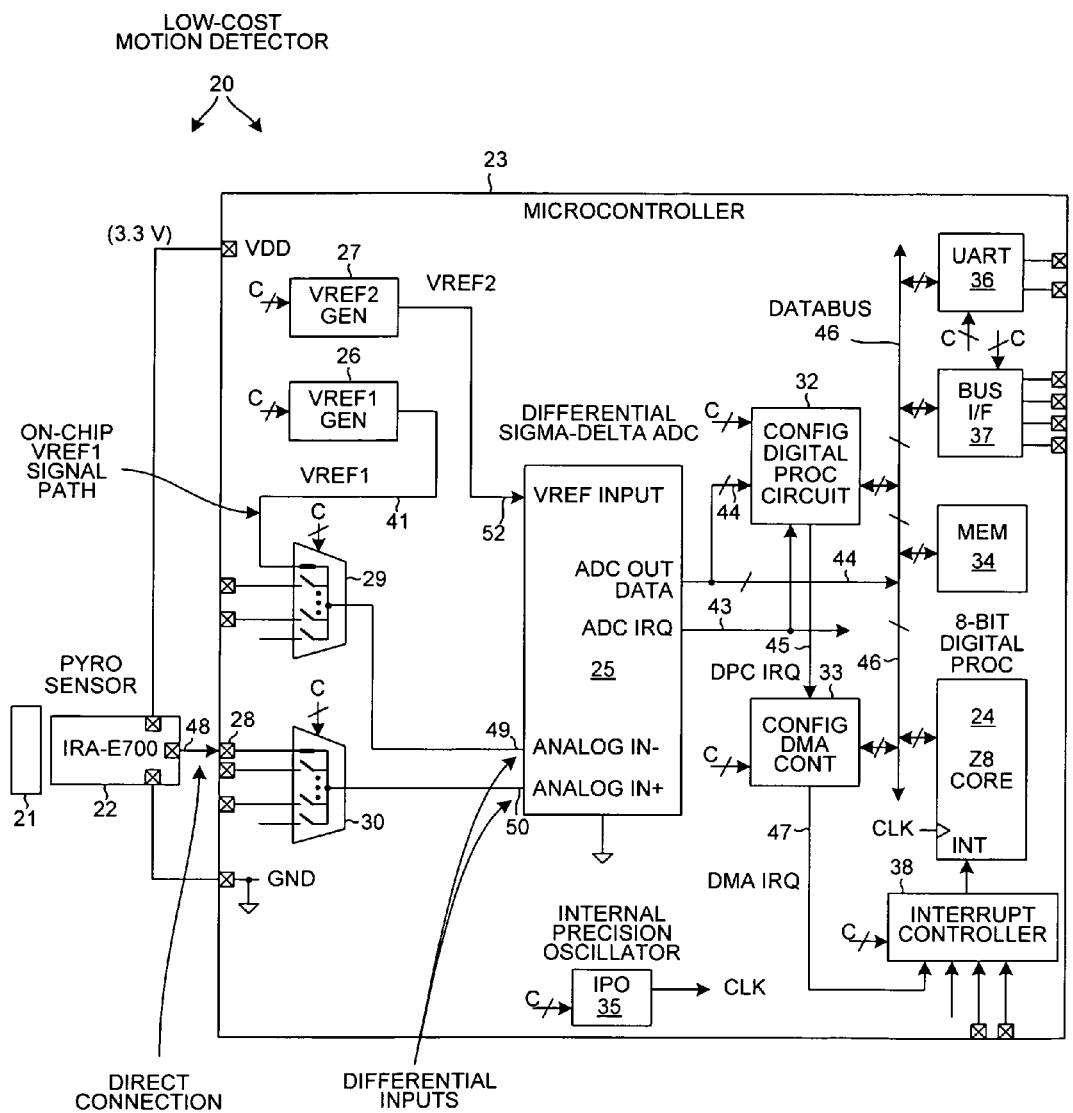
FIG. 5 is a diagram of second embodiment of a novel motion detector.

FIG. 5 is a diagram of a second embodiment in which PGDOA 31 of FIG. 2 is not used. The AC amplitudes of the desired signal and of the noise signal going into SDADC 25 are therefore much smaller than in the embodiment of FIG. 2. In the embodiment of FIG. 5, VREF1 is supplied onto the first differential input lead 49 of SDADC 25, and the pyroelectric sensor output signal is supplied onto the second differential input lead 50 of SDADC 25. The absence of signal gain in the signal path from the pyroelectric sensor to the SDADC input leads is acceptable due to special use of the resolution of SDADC. The SDADC sample window is sized and centered so that it is just large enough to accommodate the peaks of the incoming signals to be digitized. Each resulting 14-bit ADC output data value includes ten guaranteed and reliable good bits, whereas the remaining four LSB bits are covered in noise. By averaging groups of 14-bit ADC output data values together, much of the noise in the four LSB bits is averaged out. The result of the averaging is that the average values have a larger number of reliable bits (for example, fourteen reliable bits). This increased effective resolution of the SDADC, in combination with the proper sizing and centering of the SDADC input window, obviates the need for amplification of the pyroelectric sensor output sensor prior to reaching SDADC 25. The embodiment of FIG. 5 therefore does not use the PGDOA 31 of FIG. 2. Not using amplification in the input signal path is advantageous in that amplifiers that would perform such amplification may introduce noise into the signal prior to digitization. By not using PGDOA 31 and by digitizing the unamplified sensor output signal, noise in the resulting SDADC output values is minimized.

Figure 6:
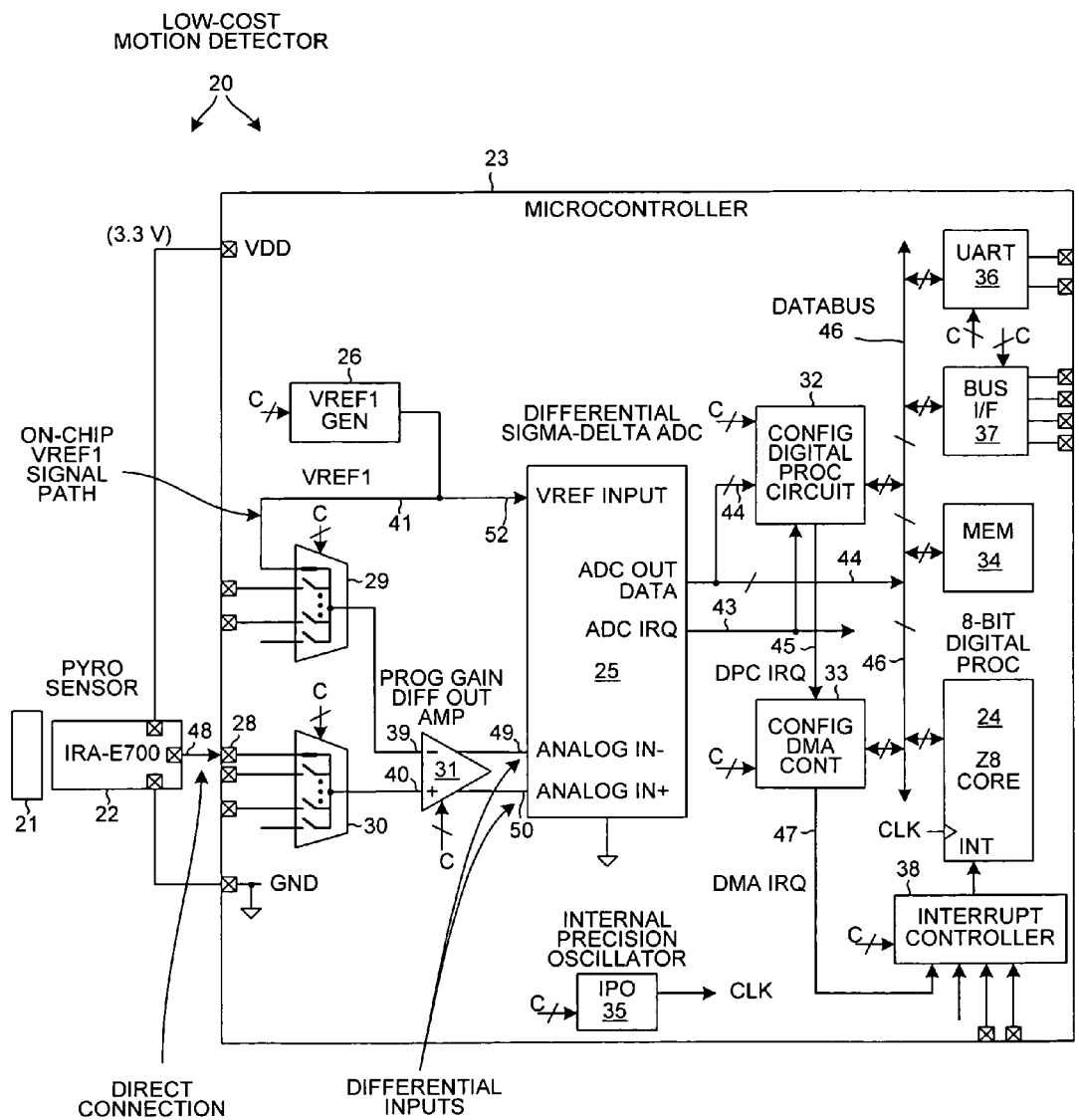
FIG. 6 is a diagram of a third embodiment of a novel motion detector.

FIG. 6 is a diagram of a third embodiment in which the second programmable internal reference voltage source 27 of FIG. 2 is not used. Rather, VREF1 is supplied onto the reference voltage input lead 52 of SDADC 25. VREF1 therefore sets the size of the SDADC window. Although the setting of the so-called "center" of the SDADC window and the setting of the "size" of, the SDADC window are not independently adjustable in this third embodiment, there may be, depending on the application, a VREF1 value that results in an acceptable window size and center. This VREF1 value may be dynamically adjusted during motion detector operation to optimize VREF1 depending on motion detector operating conditions.

Although certain specific embodiments are described above for instructional purposes, the teachings of this patent document have general applicability and are not limited to the specific embodiments described above. Circuit 32 may be an amount of programmable logic of a field programmable gate array (FPGA) architecture. The overall novel motion detector circuit of FIG. 2 has a smaller footprint than the prior art circuit of FIG. 1 that involves multiple discrete components. It is therefore easier to fit the novel circuit of FIG. 2 into the constraining three-dimensional form factor of a standard switch box such as is commonly embedded in walls in standard home construction. The circuit of FIG. 2 therefore lends itself to lighting control applications where the motion detector of the lighting control circuitry is disposed within or partially within a switch box. Such lighting control circuitry may, for example, turn off the lights in a room under certain conditions if motion is not detected in the room for a certain period of time.

Although the novel microcontroller is described above in connection with pyroelectric sensor motion detector applications, the microcontroller sees general usage in low-cost sensor applications, especially where a sensor output signal has a low amplitude desired signal that rides on a large DC offset signal. In low power applications, processor 24 is made to sleep in a low-power mode while the remainder of the circuit of FIG. 2 digitizes and processes incoming signals and places preprocessed values (preprocessed by circuit 32) into memory 34. The DMA IRQ signal on line 47 serves to wake up processor 24. After processor 24 has used the preprocessed values and made motion decisions based on the preprocessed values, processor 24 puts itself back to sleep to save power. Accordingly, various modifications, adaptations, and combinations of various features of the described embodiments can be practiced without departing from the scope of the invention as set forth in the claims.

What is claimed is:

1. A method comprising:

using an eight-bit processor to set a programmable internal reference voltage source to output a first reference voltage;

using the eight-bit processor to establish a first signal path such that the first reference voltage is supplied via the first signal path onto a first differential input lead of a sigma-delta analog-to-digital converter (SDADC);

using the eight-bit processor to establish a second signal path such that a pyroelectric sensor output signal present on a terminal is supplied from the terminal via the second signal path onto a second differential input lead of the SDADC;

performing a plurality of analog-to-digital conversions and thereby generating a plurality of ADC digital output values, wherein each ADC digital output value has more than ten bits;

low pass filtering the plurality of ADC digital output values and thereby generating a plurality of processed sample values, wherein the low pass filtering is performed by a hardware state machine that does not fetch instructions; and using the plurality of processed sample values to perform a motion detection decision function, wherein the SDADC, the eight-bit processor, the programmable internal reference voltage source, the first signal path, the terminal, and the second signal path are parts of a single microcontroller integrated circuit.

2. The method of claim 1, wherein there is amplification in the second signal path between the terminal and the second differential input lead.

3. The method of claim 1, wherein the low pass filtering is an averaging process whereby the ADC digital output values are averaged.

4. A method comprising:

using an eight-bit processor to set a programmable internal reference voltage source to output a first reference voltage;

using the eight-bit processor to establish a first signal path such that the first reference voltage is supplied via the first signal path onto a first differential input lead of a sigma-delta analog-to-digital converter (SDADC);

using the eight-bit processor to establish a second signal path such that a pyroelectric sensor output signal present on a terminal is supplied from the terminal via the second signal path onto a second differential input lead of the SDADC, wherein there is no amplification in the second signal path between the terminal and the second differential input lead;

performing a plurality of analog-to-digital conversions and thereby generating a plurality of ADC digital output values, wherein each ADC digital output value has more than ten bits;

low pass filtering the plurality of ADC digital output values and thereby generating a plurality of processed sample values; and using the eight-bit processor to perform subsequent processing on the plurality of processed sample values, wherein the SDADC, the eight-bit processor, the programmable internal reference voltage source, the first signal path, the terminal, and the second signal path are parts of a single microcontroller integrated circuit.

5. A method comprising:

using an eight-bit processor to set a programmable internal reference voltage source to output a first reference voltage;

using the eight-bit processor to establish a first signal path such that the first reference voltage is supplied via the first signal path onto a first differential input lead of a sigma-delta analog-to-digital converter (SDADC);

using the eight-bit processor to establish a second signal path such that a pyroelectric sensor output signal present on a terminal is supplied from the terminal via the second signal path onto a second differential input lead of the SDADC;

performing a plurality of analog-to-digital conversions and thereby generating a plurality of ADC digital output values, wherein each ADC digital output value has more than ten bits;

low pass filtering the plurality of ADC digital output values and thereby generating a plurality of processed sample values;

using the eight-bit processor to perform subsequent processing on the plurality of processed sample values, wherein the SDADC, the eight-bit processor, the programmable internal reference voltage source, the first signal path, the terminal, and the second signal path are parts of a single microcontroller integrated circuit;

using the eight-bit processor to set a second programmable internal reference voltage source to output a second reference voltage; and supplying the second reference voltage onto a voltage reference input lead of the SDADC, wherein the second reference voltage sets an input sample window size of the SDADC.

6. A method comprising:

using an eight-bit processor to set a programmable internal reference voltage source to output a first reference voltage;

using the eight-bit processor to establish a first signal path such that the first reference voltage is supplied via the first signal path onto a first differential input lead of a sigma-delta analog-to-digital converter (SDADC);

using the eight-bit processor to establish a second signal path such that a pyroelectric sensor output signal present on a terminal is supplied from the terminal via the second signal path onto a second differential input lead of the SDADC;

performing a plurality of analog-to-digital conversions and thereby generating a plurality of ADC digital output values, wherein each ADC digital output value has more than ten bits;

low pass filtering the plurality of ADC digital output values and thereby generating a plurality of processed sample values, wherein said low pass filtering is performed by a state machine that does not fetch instructions, and wherein said low pass filtering is not performed by said eight-bit processor; and using the eight-bit processor to perform subsequent processing on the plurality of processed sample values, wherein the SDADC, the eight-bit processor, the programmable internal reference voltage source, the first signal path, the terminal, and the second signal path are parts of a single microcontroller integrated circuit.

7. A method comprising:

using an eight-bit processor to set a programmable internal reference voltage source to output a first reference voltage;

using the eight-bit processor to establish a first signal path such that the first reference voltage is supplied via the first signal path onto a first differential input lead of a programmable gain differential output amplifier (PGDOA);

using the eight-bit processor to establish a second signal path such that a pyroelectric sensor output signal present on a terminal is supplied from the terminal via the second signal path onto a second differential input lead of the PGDOA;

coupling a pair of differential output leads of the PGDOA to a corresponding pair of differential input leads of a differential input sigma-delta analog-to-digital converter (SDADC);

using the SDADC to perform a plurality of analog-to-digital conversions thereby generating a plurality of ADC digital output values, wherein each ADC digital output value has more than ten bits;

low pass filtering the plurality of ADC digital output values and thereby generating a plurality of processed sample values, wherein the low pass filtering is performed by a hardware state machine that does not fetch instructions; and using the eight-bit processor to perform subsequent processing on the plurality of processed sample values, wherein the eight-bit processor, the PGDOA, the SDADC, the programmable internal reference voltage source, the first signal path, the terminal, and the second signal path are parts of a single microcontroller integrated circuit.

8. A microcontroller integrated circuit comprising:

an eight-bit processor;

a programmable differential output gain amplifier (PDOGA) having a first differential input lead, a second differential input lead, a first differential output lead, and a second differential output lead, wherein the processor can change a gain of the PDOGA by setting a first control register value;

a differential input sigma-delta analog-to-digital converter (SDADC) having a first differential input lead coupled to the first differential output lead of the PDOGA, and having a second differential input lead coupled to the second differential output lead of the PDOGA;

a first programmable internal reference voltage source that outputs a first reference voltage VREF1, wherein the processor can change VREF1 by setting a second control register value;

a second programmable internal reference voltage source that outputs a second reference voltage VREF2, wherein the processor can change VREF2 by setting a third control register value;

a terminal;

a first analog multiplexing circuit that is programmable to couple a selected one of a first plurality of signals onto the first differential input lead of the PDOGA, wherein one of the first plurality of signals is VREF1, wherein the processor can set which one of the first plurality of signals is selected by setting a fourth control register value; and a second analog multiplexing circuit that is programmable to couple a selected one of a second plurality of signals onto the second differential input lead of the PDOGA, wherein one of the second plurality of signals is a signal received onto microcontroller via the terminal, wherein the processor can set which one of the second plurality of signals is selected by setting a fifth control register value.

9. The microcontroller integrated circuit of claim 8, wherein the SDADC has a voltage reference input lead, and wherein the second reference voltage VREF2 is supplied via an internal path from the second programmable internal reference voltage source to the voltage reference input lead of the SDADC.

10. The microcontroller integrated circuit of claim 8, further comprising:

a configurable digital processing circuit that can be configured to receive a plurality of digital output values from the SDADC, perform processing on the plurality digital output values, and generate a plurality of processed values, wherein the configurable digital processing circuit is a state machine that can perform said processing without fetching instructions.

11. The microcontroller integrated circuit of claim 10, wherein said processing involves averaging at least some of the digital output values.

12. The microcontroller integrated circuit of claim 10, further comprising:

a configurable direct memory access (DMA) circuit that is configurable to move the plurality of processed values from the configurable digital processing circuit to another portion of the microcontroller integrated circuit.

13. The microcontroller integrated circuit of claim 8, wherein the terminal is coupled to a pyroelectric sensor without any intervening active circuitry.

14. A microcontroller integrated circuit comprising:

an eight-bit processor;

a differential input sigma-delta analog-to-digital converter (SDADC) having a first differential input lead and a second differential input lead;

a programmable internal reference voltage source that outputs a first reference voltage VREF1, wherein the processor can change VREF1;

a terminal;

a first analog multiplexing circuit that is controlled by the processor to couple VREF1 to the first differential input lead of the SDADC; and a second analog multiplexing circuit that is controlled by the processor to couple a signal on the terminal onto the second differential input lead of the SDADC wherein the first reference voltage sets the center of the SDAC input sample window, thereby avoiding the need to provide an external AC blocking capacitor.

15. The microcontroller of claim 14, wherein the signal on the terminal is received from a pyroelectric sensor.

16. The microcontroller of claim 14, wherein the SDADC has a voltage reference input lead, and wherein the first reference voltage VREF1 from the programmable internal reference voltage source is supplied onto the voltage reference input lead of the SDADC.

17. A microcontroller integrated circuit comprising:

an eight-bit processor;

a differential input sigma-delta analog-to-digital converter (SDADC) having a first differential input lead and a second differential input lead;

a programmable internal reference voltage source that outputs a first reference voltage VREF1, wherein the processor can change VREF1;

a terminal;

a first analog multiplexing circuit that is controlled by the processor to couple VREF1 to the first differential input lead of the SDADC;

a second analog multiplexing circuit that is controlled by the processor to couple a signal on the terminal onto the second differential input lead of the SDADC; and a hardware averaging circuit that receives a plurality of digital output values from the SDADC, performs processing on the plurality digital output values, and generates a plurality of processed values, wherein the hardware averaging circuit is a state machine that does not fetch instructions.

18. The microcontroller integrated circuit of claim 17, further comprising:

a direct memory access (DMA) controller circuit that reads the plurality of processed values from the hardware averaging circuit and that writes the plurality of processed values to another portion of the microcontroller integrated circuit.

19. A microcontroller integrated circuit comprising:

an eight-bit processor;

a differential input sigma-delta analog-to-digital converter (SDADC) having a first differential input lead and a second differential input lead, wherein the SDADC outputs SDADC output values, wherein each SDADC output value includes more than ten data bits, and wherein a pyroelectric sensor output signal is present on the second differential input lead of the SDADC;

a programmable internal reference voltage source that outputs a first reference voltage VREF1, wherein the eight-bit processor can change VREF1; and means for supplying VREF1 onto the first differential input lead of the SDADC, wherein the means does not extend outside the microcontroller integrated circuit.

20. The microcontroller integrated circuit of claim 19, wherein the means involves an analog multiplexer, wherein one data input lead of the analog multiplexer is connected to a terminal of the microcontroller integrated circuit.

21. A microcontroller integrated circuit comprising:

an eight-bit processor;

a differential input sigma-delta analog-to-digital converter (SDADC) having a first differential input lead and a second differential input lead, wherein the SDADC outputs SDADC output values, wherein each SDADC output value includes more than ten data bits, and wherein a pyroelectric sensor output signal is present on the second differential input lead of the SDADC;

a programmable internal reference voltage source that outputs a first reference voltage VREF1, wherein the eight-bit processor can change VREF1; and means for supplying VREF1 onto the first differential input lead of the SDADC, wherein the means does not extend outside the microcontroller integrated circuit, wherein the microcontroller integrated circuit receives a supply voltage, wherein the SDADC has an input sample window size that is smaller than the supply voltage, and wherein the eight-bit processor can change the input sample window size.

* * * * *